United States Patent [19]

Vinson et al.

[11] 4,354,307
[45] Oct. 19, 1982

[54] METHOD FOR MASS PRODUCING MINIATURE FIELD EFFECT TRANSISTORS IN HIGH DENSITY LSI/VLSI CHIPS

[75] Inventors: Mark A. Vinson, San Diego; Rakesh Kumar, Escondido; Norman W. Jones, Poway, all of Calif.; Michael R. Gulett, Fort Collins, Colo.

[73] Assignee: Burroughs Corporation, Detroit, Mich.

[21] Appl. No.: 99,515

[22] Filed: Dec. 3, 1979

[51] Int. Cl.$^3$ ............................................ H01L 21/263
[52] U.S. Cl. ........................................ 29/571; 29/589; 148/1.5
[58] Field of Search .................... 29/571, 589; 357/23; 148/1.5

[56] References Cited

U.S. PATENT DOCUMENTS

| | | | |
|---|---|---|---|
| 3,571,913 | 3/1971 | Bodway et al. | 29/571 |
| 3,590,471 | 7/1971 | Lepselter et al. | 29/571 |
| 3,938,243 | 2/1976 | Rosvold | 29/589 |
| 4,053,335 | 10/1977 | Hu | 148/1.5 |
| 4,152,823 | 5/1979 | Hall | 29/589 |
| 4,173,818 | 11/1979 | Bassous et al. | 29/571 |
| 4,220,116 | 9/1980 | Hochberg | 118/715 |

OTHER PUBLICATIONS

Beyer et al, Gettering and Barrier Technique, IBM Technical Disclosure Bulletin, vol. 19, No. 6, Nov. 1976, pp. 2050-2051.
Dennard et al, Design of Ion Implanted MOSFETs IEEE Journal of Solid State Circuits, vol. SC-9, No. 5, Oct. 1974, pp. 256-268.

Primary Examiner—Donald L. Walton
Attorney, Agent, or Firm—Charles J. Fassbender; J. Ronald Richbourg; Kevin R. Peterson

[57] ABSTRACT

In the disclosed method, dopant atoms of a first conductivity type are implanted into the surface of a semiconductor substrate to form a channel region of each transistor having a relatively high dopant density at a predetermined depth below the surface and a substantially lower dopant density at the surface. This eliminates reachthrough in the channel without adversely increasing the channels threshold voltage. Thereafter, dopant atoms of a second conductivity type are implanted into the substrate to form source and drain regions adjacent to the channels having a depth of less than 0.3 μm below the surface. This minimizes the radius of curvature and corresponding depletion width at the respective junctions with the channel. Subsequently, a patterned insulating layer is formed on said surface at temperatures that are far below the insulating layer's flow point. This avoids diffusing the distribution of the implanted dopant atoms. Later, a layer of metallic contact is formed in an opening of the patterned insulating layer that exposes one of the source and drain regions. This layered metallic contact has a lower layer which is comprised of a material that prevents an upper layer from penetrating through the exposed source or drain region.

18 Claims, 12 Drawing Figures

METHOD FOR MASS PRODUCING MINIATURE FIELD EFFECT TRANSISTORS IN HIGH DENSITY LSI/VLSI CHIPS

BACKGROUND OF THE INVENTION

This invention relates to methods for fabricating semiconductor devices, and more particularly to, methods for mass producing high density field effect transistors having gate lengths that are substantially shorter than those which are now commercially available. Those gate lengths are in the range of 3.5–4.5 micrometers. This is evidenced for example, by a recent article entitled "The Race Heats Up in Fast Static RAMs", published in *Electronic,* Apr. 26, 1979 at pages 125–135.

In the past, many research projects have been carried out to devise a mass production method for fabricating field effect transistors of smaller dimensions. But to date, due to various technological problems, the disclosed devices remain in the laboratory. A current review of the state of this technology, which considers gate lengths of approximately 1.0 micrometers, is presented in a series of eight papers in the *IEEE Journal of Solid State Circuits,* Vol. SC-14, No. 2, April 1979, at pages 240–301.

One important requirement that must be met in any mass production LSI/VLSI process is that the transistors which are thereby produced have a very low probability of being defective. This is because, one defective transistor in an LSI/VLSI chip generally will make the entire chip inoperative. Thus for example, if each chip contains 100,000 transistors, then the probability that any one of those transistors will be produced with a defect must approach 1/100,000 to obtain resonable production yields. On the other hand, the above requirements need not even be considered when only a few short gate length transistors or very small scale integrated circuits are produced for evaluation in the laboratory, such as those which are discussed in the above referenced IEEE papers.

Therefore, a primary object of the present invention is to provide an improved method of fabricating miniature field effect transistors.

Still another more specific object of the invention is to provide a method of mass producing 2.5 micrometer gate length field effect transistors in high density LSI/VLSI chips with reasonable yields.

BRIEF SUMMARY OF THE INVENTION

These and other objects are accomplished in accordance with the invention by a method wherein dopant atoms of a first conductivity type are implanted into the surface of a semiconductor substrate to form a channel region of each transistor having a relatively high dopant density at a predetermined depth below the surface and a substantially lower dopant density at the surface. This eliminates reachthrough in the channel without adversely increasing the channel's threshold voltage. Thereafter, dopant atoms of a second conductivity type are implanted into the substrate to form source and drain regions adjacent to the channels having a depth of less than 0.3 μm below the surface. This minimizes the radius of curvature and corresponding depletion width at the respective junctions with the channel. Subsequently, a patterned insulating layer is formed on said surface at temperatures that are far below the insulating layer's flow point. This avoids diffusing the distribution of the implanted dopant atoms. Later, a layer of metallic contact is formed in an opening of the patterned insulating layer that exposes one of the source and drain regions. This layered metallic contact has a lower layer which is comprised of a material that prevents an upper layer from penetrating through the exposed source or drain region.

BRIEF DESCRIPTION OF THE DRAWINGS

Various other features and advantages of the invention will best be understood by reference to the following detailed description and accompanying drawings wherein.

DETAILED DESCRIPTION

Figure 1A:
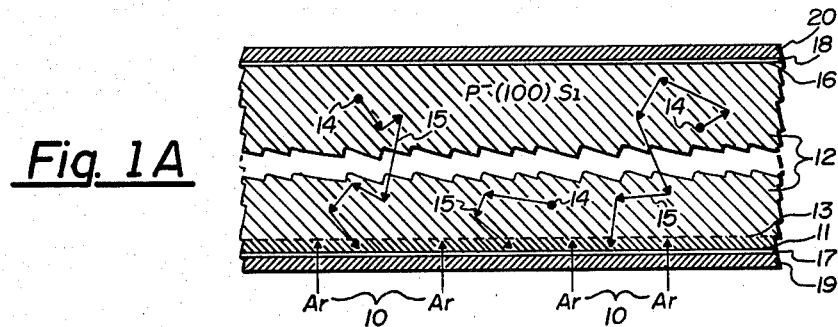
FIGS. 1a–1b are a set of greatly enlarged cross-sectional views of transistors at various stages of the disclosed fabrication process.

Referring now to FIGS. 1a–1f, the details of one preferred process for forming field effect transistors in accordance with the invention will be described. Initially, as illustrated in FIG. 1a, argon atoms 10 are implanted into a backside surface 11 of a semiconductor substrate 12. Suitably, substrate 12 is made of silicon that has been extrinsically doped with P-type atoms to a density of approximately $0.8 \times 10^{15}$ atoms/cm$^3$.

This implantation is performed to locally disrupt the inter-atomic bonding of the substrate up to a predetermined depth 13. These disrupted bonds then act as a "trap" for various impurities 14 in the substrate, such as iron or copper. Suitably, the peak of the argon implant is approximately 800 Å beneath surface 11. This is achieved by implanting the atoms at an energy of approximately 80 KEV, and a density of $1-5 \times 10^{15}$ atoms/cm$^2$.

Subsequently, substrate 12 is heated to a temperature that is higher than any of those that are used throughout the remaining steps of the process. Suitably, this temperature is 1000° C.–1200° C., and lasts approximately an hour. As a result, the impurity atoms 14 diffuse along random paths 15 toward surface 11 and get trapped in the disrupted bonding sites.

Thereafter, insulating layers 17 and 18 of approximately 300 Å thickness are formed on the backside surface 11 and frontside surface 16 respectively. Suitably, this is achieved by exposing substrate 12 to an atmosphere of oxygen at 900° C. for approximately 60 minutes. Small amounts of HCl, such as about 2% for example, may also be added to improve the oxide quality. Thereafter, layers of silicon nitride 19 and 20 of approximately 1500 Å thickness are deposited respectively on the insulating layers 17 and 18.

Figure 1B:
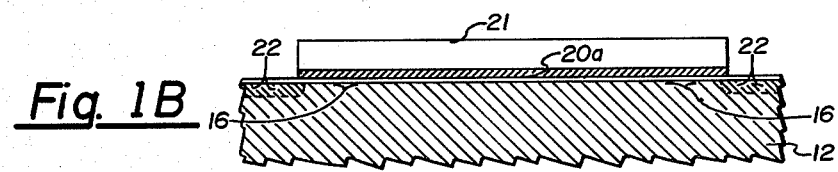

Later, a layer of photoresist (not shown) is deposited on the frontside silicon nitride layer 20. This photoresist is then patterned by use of a mask such that it overlies only the active areas of the substrate, i.e., those areas where devices are to be fabricated. In FIG. 1b, this patterned photoresist is indicated by reference numeral 21. No photoresist is deposited on the backside silicon nitride layer 19.

Those portions of the silicon nitride layer 20 which are not covered by the patterned photoresist layer 21 are subsequently removed. Reference numeral 20a indicates that portion of the frontside silicon nitride layer 20 which remains after this removal step is performed. At the same time, all of the backside silicon nitride layer 19 is removed. Suitably, these removals are achieved by a plasma etch.

Thereafter, a field implant is performed into the exposed frontside surface 16 of substrate 12. Suitably, this implant uses boron atoms at an energy of approximately 100 KEV and a density of $1 \times 10^{13}$ atoms/cm$^2$. Reference numeral 22 indicates the doped regions that are formed by this implant step.

Later, this patterned photoresist layer 21 is removed; and an oxide layer is formed on that portion of the frontside surface 16 which is not covered by the patterned nitride layer 20a, and on the entire backside surface 11. This oxide layer is relatively thick (approximately 8000 Å) and it is formed by exposing substrate 12 to an atmosphere of oxygen and hydrogen at 900° C. for approximately 10 hours.

On the frontside surface 16, the patterned insulating layer 23 serves to physically separate and electrically isolate the active regions from one another. In comparison, on the backside surface 11, the thick oxide layer consumes that portion of the above described substrate 12 which has the disrupted inter-atomic bonding. There, all of the impurity atoms 14 become trapped permanently in the oxide.

As a result of this trapping of the impurity atoms 14, reverse leakage current in the active devices that are subsequently formed on substrate 12 is greatly reduced. In one experiment, the transistors on a substrate that was subjected to the above steps had a reverse leakage current density through its source and drain junctions of approximately $1.9 \times 10^{-10}$ amps/cm$^2$ at a reverse voltage of 2 volts, and $2.7 \times 10^{-10}$ amps/cm$^2$ at a reverse voltage of 10 volts. By comparison, other transistors that were identically formed but which bypassed the argon implant and related anneal and oxidation steps had a reverse leakage current density of approximately $7.7 \times 10^{-10}$ amps/cm$^2$ at a reverse voltage of 2 volts, and $38.5 \times 10^{-10}$ amps/cm$^2$ at a reverse voltage of 10 volts.

In some cases, it may be desirable to remove the oxide layer from the backside surface 11. This may be achieved by coating the frontside surface 16 of substrate 12 with a layer of photoresist, and etching the oxide from the backside surface with a mixture of water and hydrofluoric acid in a six to one ratio. Thereafter, the layers of photoresist and patterned nitride 20a may be stripped from the frontside surface 16 with suitable etchants.

Figure 1C:
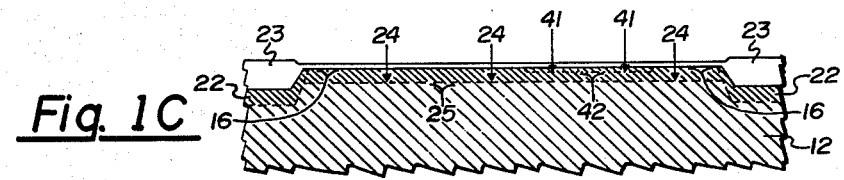

Subsequently, dopant atoms of the same conductivity type as those which are extrinsically included in the substrate are implanted into that portion of the frontside surface 16 which is not covered by the patterned field oxide layer 23. This implant is indicated in FIG. 1c by reference numeral 24. Basically, the energy level of this implant is chosen such that a relatively high dopant density results at a predetermined depth 25 below surface 16 while a substantially lower dopant density results at the surface 16.

As one specific example of the above step, boron atoms may be implanted at an energy level of 60 KEV and a density of $2.5 \times 10^{11}$ atoms/cm$^2$. This places the peak of the high dopant density 25 at approximately 1900 Å below surface 16. Preferably, the magnitude of this peak dopant density is at least 20 times larger than the dopant density at surface 16 and the bulk of substrate 12. In one exemplary embodiment, the peak density is $12.2 \times 10^{15}$ atoms/cm$^3$.

Due to implant 24, the transistors which subsequently are formed over the implanted areas have substantially reduced depletion regions around their source and drain. And this in turn allows the spacing between the source and drain (i.e., the gate length) to be made relatively small without encountering "punch through" problems. This is illustrated in greater detail in FIG. 2.

In that figure, reference numeral 25 again indicates the above described deep implant between the field oxide regions 23; and reference numerals 30, 31, and 32 respectively indicate the source, gate, and drain of a transistor which is formed over the implant. This transistor has a channel length which equals the gate length L minus the widths of the source and drain depletion regions minus the distance by which the gate overlaps the source or drain region.

Figure 2:
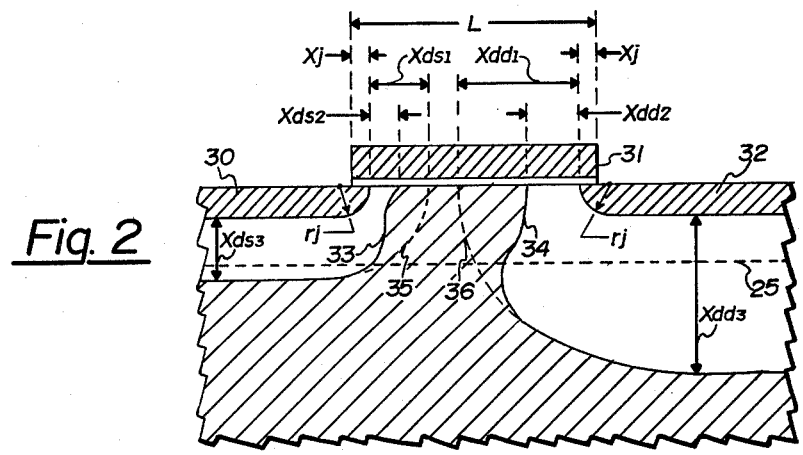
FIG. 2 is a greatly enlarged cross-sectional view of one of the above transistors illustrating the significance of the deep channel implant that is performed in FIG. 1c.

Without implant 24, the source and drain depletion regions would be essentially circular shaped as indicated by reference numerals 35 and 36 respectively. However, with implant 24, the shape of the source and drain depletion regions becomes distorted beneath the gate as indicated by reference numerals 33 and 34. Thus, the affect of implant 24 is to increase channel length by an amount $X_{ds1} - X_{ds2} + X_{dd1} - X_{dd2}$. All of the terms in this expression are defined as illustrated in FIG. 2.

It should also be pointed out, that a more direct approach to increasing channel length would be to simply increase the extrinsic doping level throughout substrate 12. Unfortunately however, this also has many undesirable side effects. For example, it shifts the threshold voltage for the transistors to an undesirable high level. Further, the extrinsic doping level of mass produced semiconductor substrates can only be controlled to about ±35% without unreasonably increasing the substrate's cost. Thus, accurate control over the devices threshold voltage cannot be achieved.

By comparison, the deep implant 24 increases the substrate doping only at a predetermined depth and only in those regions that are not covered by field oxide. This distorts the source and drain depletion regions from their normal circular shape and causes less of an increase in threshold voltage than that which would occur if the same insulation between transistors were to be obtained by increasing the extrinsic doping level throughout the substrate. Further, the implant doping density is controllable to within ±2%, and since its magnitude is at least twenty times the extrinsic doping level of the substrate, it is this variation which dominates.

Following the above steps, a layer of photoresist is disposed on the frontside surface 16. Thereafter, it is patterned to provide openings over the regions where depletion transistors are to be formed. Dopant atoms 41 of a conductivity type that is opposite to the above described deep implant 24 are then implanted through the openings to form a shallow layer 42. Suitably, this step is performed by implanting arsenic atoms at 40 KEV and a density of $2 \times 10^{12}$ atoms/cm$^2$.

Thereafter, this photoresist is stripped; and the substrate is annealed to activate the implanted atoms 24 and 41 as substitutional impurities in the substrate lattice structure. This annealing is carried out at a temperature which is sufficiently high to repair most of the substrate bonding that was disrupted by the implant. But the temperature must also be sufficiently low to prevent the dopant atoms 24 and 41 from diffusing and substantially changing their implanted profile. These conflicting requirements may be met by annealing the substrate at 900° C. for approximately 30 minutes.

Figure 1D:
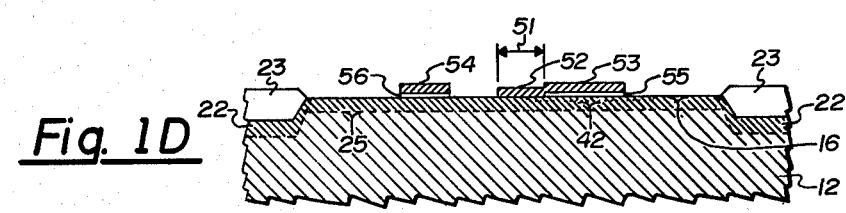

Next, referring to FIG. 1d, a gate oxide is formed over surface 16. Suitably, this gate oxide is 470 Å thick; and is formed by exposing surface 16 to an atmosphere of oxygen for approximately 2 hours at 900° C. Thereafter, a layer of photoresist is deposited on the gate oxide layer, and it is patterned to have openings where the first level poly is to make contact with N+ diffusions in the substrate. One such region is indicated by reference numeral 51 in FIG. 1d.

That portion of the gate oxide which is exposed through the openings in the photoresist over region 51 is then removed by a selective etchant such as a 20 to 1 solution of water and BHF. Thereafter, the photoresist is stripped, and a layer of doped polysilicon is deposited over the surface. Preferably, this is achieved by exposing the substrate to a gaseous mixture of 2% arsine, 40% silane, and 58% of a carrier gas such as nitrogen. The above deposition is performed at a temperature of approximately 600° C., a pressure of approximately 1.1 torr, and lasts for a time interval of approximately 200 minutes to produce a doped polysilicon layer that is approximately 4000 Å.

Since this polysilicon layer is doped as deposited, much lower resistances are obtained with a relatively low temperature annealing step of relatively short duration, such as 900° C. for 30 minutes. This would not be possible by using conventional ion implanted polysilicon layers. It is important to minimize the temperature and time duration of such an anneal in order to not diffuse and destroy the above described dopant density profile in the channel. Preferably, this anneal step is performed later in the process as the same one that is used to activate the source and drain regions.

Thereafter, a layer of photoresist is disposed on the doped polysilicon layer. Then, the photoresist is patterned to cover the transistor gates and corresponding first level poly interconnects. The uncovered polysilicon is then removed by a selective etchant leaving polysilicon portions 52, 53, and 54 as illustrated in FIG. 1d.

Preferably, an anisotropic planar plasma is used in the above step to form the polysilicon portions 52, 53, and 54. This enables the length of the gates 53 and 54 to be controlled to within about $\pm 0.2$ $\mu$m of the photoresist's dimensions. Thus, the various features which are herein disclosed to form transistors with short channels are negated by loosely controlled tolerances on the gate length.

Following those steps, the resist is stripped, and the gate oxide which is not covered by any of the patterned polysilicon layers is removed by a selective etchant. Those portions of the gate oxide layer which remain after this step are indicated in FIG. 1d by reference numerals 55 and 56.

Subsequently, the source and drain regions 61, 62, and 63 are formed. This is achieved by a shallow ion implant of dopant atoms of the second conductivity type into that portion of the frontside surface 16 which is not covered by either the field oxide 23 or the shaped polysilicon regions 52, 53, and 54. Suitably, arsenic atoms are implanted at an energy of 50 KEV and a density of $4 \times 10^{15}$ atoms/cm$^2$.

Figure 3:
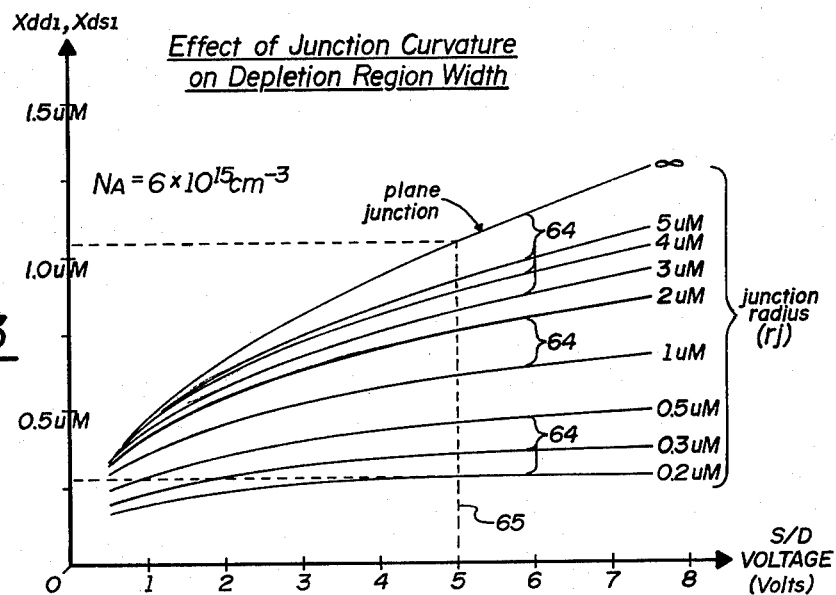
FIG. 3 is a set of curves illustrating the significance of the shallowed source and drain junctions that are formed in the exposed surface of FIG. 1d.

In performing this step, the radius of curvature of the perimeter of the source and drain regions 61, 62, and 63 and the depth of those regions beneath surface 16 is formed to be approximately 0.2–0.3 micrometers. Minimizing this radius of curvature has the beneficial effect of decreasing the length of the circular shaped depletion regions that were previously indicated in FIG. 2 as $X_{ds1}$ and $X_{dd1}$. The exact manner in which the depletion region lengths $X_{ds1}$ and $X_{dd1}$ vary as the radius of curvature $r_j$ is decreased is illustrated by the set of curves 64 in FIG. 3.

Basically, the shorter depletion region length that is achieved by reducing the junction radius $r_j$ is due to a change in the electric field that occurs around the junctions perimeter as the radius of curvature is decreased. That is, with the surface charge density of a cylindrically shaped junction being held constant, the electric field around the junction falls off more rapidly with distance as the junction radius $r_j$ is reduced. This can be expressed mathematically as $$E \propto \frac{r_j}{(X + r_j)}$$

where X is the radial distance from the junction surface.

For comparison, it should be noted that the width of the depletion regions $X_{ds3}$ and $X_{dd3}$ which lie directly beneath the source and drain regions are substantially greater than the above described depletion region lengths $X_{ds1}$ and $X_{dd1}$ around the junction's perimeter. The relationship between the length of these depletion regions may also be expressed mathematically as $X_{ds1} = X_{ds3} \text{EXP}(-X_{ds1}/r_j)$, and $X_{dd1} = X_{dd3} \text{EXP}(-X_{dd1}/r_j)$.

The lengths of the depletion regions $X_{ds3}$ and $X_{dd3}$ however, are not important in controlling short channel effects. They are mentioned herein only to emphasize the point that by reducing the radius of curvature $r_j$ of the source and drain perimeter, the length of the depletion regions are minimized where it is needed most—namely in the channel region. And as is indicated by reference numeral 65 in FIG. 3, source and drain regions having a radius of curvature of approximately 0.25 micrometers, have a corresponding depletion region length in the channel of only approximately 0.25 micrometers with +5 volts applied; whereas the corresponding depletion region length directly beneath those source and drain regions is more than 1.0 micrometer.

Figure 1E:
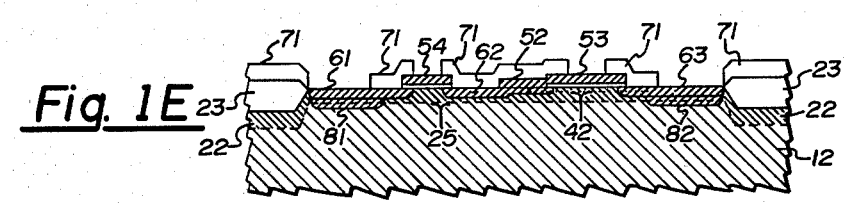

Next, a layer of silicon dioxide is deposited over the frontside surface 16 and the patterned polysilicon regions 52, 53, and 54 which lie thereon. This insulating layer is then patterned as illustrated in FIG. 1e by reference numeral 71. The patterning is achieved by utilizing photoresist, a mask, and selective etchants as has been described above.

In forming the patterned insulating layer 71, the temperatures must be kept below those which will cause significant diffusion of any of the previously implanted dopant impurity atoms. That is, the doping profile of the deep implant 25 in the channel region and the shallow implant of the source and drain regions 61, 62, and 63 must not be significantly altered in order to achieve the beneficial effects that were described in conjunction with FIGS. 2 and 3. For this to occur, insulating layer 71 must be initially deposited as a smooth layer which does not need to be reflowed after its deposition.

By comparison, the common practice of the prior art is to initially deposit insulating layers of silicon dioxide with a relatively rough surface. A typical profile of one such surface is indicated by reference numeral 72 in FIG. 4. This surface is characterized as having peaks 73 that lie directly above the edges of any underlying polysilicon region, and having valleys 74 that lie along side of those polysilicon edges. Even though the deposition temperature may be relatively low, this rough surface must be subsequently smoothed out by heating the silicon dioxide layer 72 to a temperature at which it begins to soften and flow.

For silicon dioxide, the flow temperature is approximately 1050° C.; which also causes substantial diffusion in any implanted regions. This flow temperature can be lowered somewhat, and the flow rate above that temperature can also be slightly improved, by adding a small dosage of phosphorus (such as 4%) to the silicon dioxide. However, the resulting flow temperature is still too high for use in the present invention. Further, the phosphorus atoms tend to react with any moisture to form phosphoric acid, which greatly reduces the transistors reliability.

Figure 4:
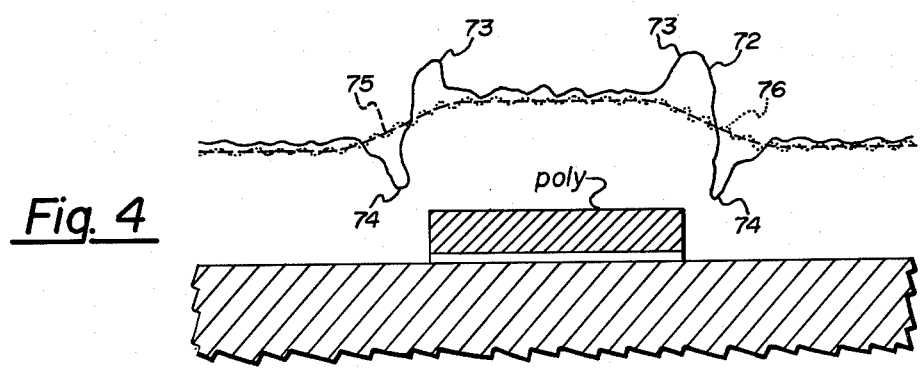
FIG. 4 is a greatly enlarged cross-sectional view illustrating the significance of the manner in which the patterned insulating layer is formed in FIG. 1e.

In the present invention, the patterned insulating layer 71 is formed in a specially designed vapor deposition system which is described in copending patent application Ser. No. 955,653 by Arthur Hochberg, filed Oct. 30, 1978 now U.S. Pat. Ser. No. 4,220,116 issued Sept. 2, 1980. Basically, the deposition system there described includes a novel arrangement of plenums and openings which inject the reactant gases in a more uniform distribution and lower subatmospheric pressure than had previously been achieved. The important result for our purposes is that the silicon dioxide layer which is formed is deposited with a sufficiently smooth surface such that no high temperature reflow is required. A typical profile of the surface of an insulating layer as formed in that reactor is indicated in FIG. 4 by reference numerals 75. This deposition takes place in the reactor at a temperature of approximately only 450° C.

Following the formation of patterned low temperature insulating layer 71, another implant step is performed. This implant is made through the opening of the patterned insulating layer to form dopant regions 81, 82, and 83. Preferably, this implant step is performed using phosphorus atoms at an energy level of 50 KEV, and a density of $1.5 \times 10^{15}$ atoms/cm$^2$. Phosphorus is preferred over other N-type atoms such as arsenic, since it has a relatively high diffusivity. A low temperature anneal is then performed to activate the implanted area as was previously described in conjunction with the formation of implant regions 61, 62, and 63.

By inspection of FIG. 1e, it can be seen that the implanted regions 81 and 82 have radius of curvatures at their perimeter which is substantially larger than the previously described radius of curvature $r_j$ of the shallow junction implant regions 61, 62, and 63. This, however, does not decrease the length of the channels under the gates 53 and 54 because the doped regions 81 and 82 are spaced sufficiently far away from those gates.

Further, the implant regions 81 and 82 serve the purpose of insuring that no shorts to substrate 12 occur at the perimeter of the openings in the patterned insulating layer 71. If regions 81 and 82 were not implanted, such shorts could occur with the conductor which will make contact to the source/drain 61 and 63, at the point where the field oxide regions 23 lie along side of the source/drain regions. Alternatively, these shorts can be avoided by insuring that the openings in the patterned insulating layer 71 always lie within the implant regions 61 and 63; however, that requires the implant region 61 and 63 to be larger and occupy more chip area, thus decreasing circuit density.

Figure 1F:
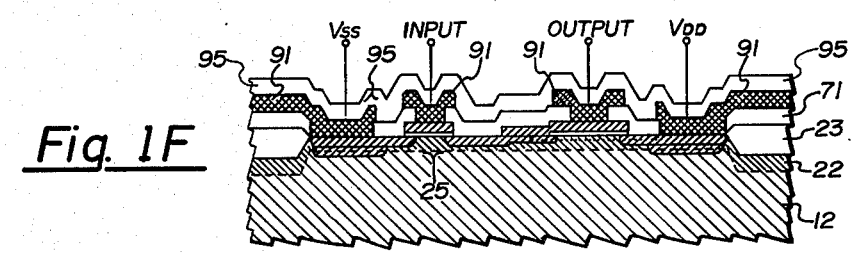

Layered metallic contacts 91 are thereafter made throughout the openings of the patterned insulating layer 71 to the underlying source, drain, and gate regions. These contacts are illustrated in FIG. 1f. Basically, the layered structure of these contacts is provided to prevent them from penetrating through the shallow source and drain regions.

Figure 5:
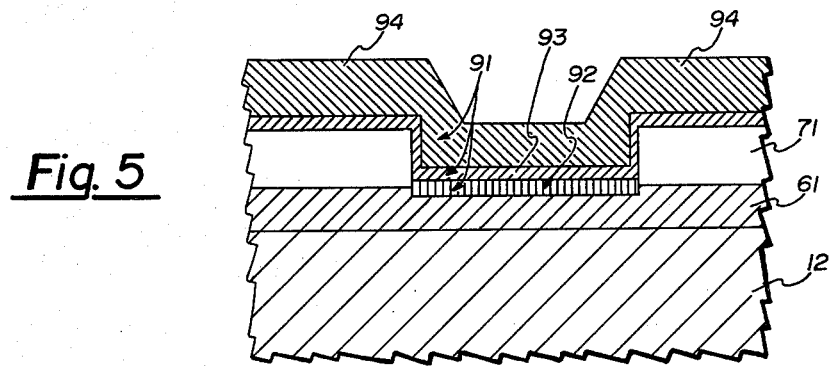
FIG. 5 is a greatly enlarged cross-sectional view of the layered metal contacts that are formed in FIG. 1f.

A greatly enlarged cross sectional view of one of these layered contacts 91 is illustrated in FIG. 5. It is formed by initially depositing a layer of a noble metal over patterned insulating layer 71, the exposed source, rain, and gate regions. Preferably, this noble metal is platinum and it is deposited to a thickness of about 200–300 Å. Thereafter, the metal is heated to a sufficiently high temperature such as 450° C. which causes it to react in only the source and drain regions to form platinum silicide. This reaction is self limiting in that the thickness of the platinum silicide layer that is formed is directly determined by the thickness of the platinum that is deposited.

Subsequently, that portion of the noble metal which was lying on the patterned insulating layer 71 (and which did not react to form a silicide) is removed by a suitable etchant, such as Aqua Regia. The PtSi in the contacts is protected by native oxide layer that grows on it during above anneal. Thereafter, the oxide is sputter etched, and a layer of a barrier metal 93 which prevents the diffusion of a preselected conductive material through it, is deposited on the patterned insulating layer 71 and the silicide 92. Suitably, this barrier material is TiW; and it is deposited with a thickness of approximately 1000 Å.

Thereafter, a layer of the preselected conductive material 94 is deposited on layer 93. Suitably, this material is aluminum; and it is deposited to a thickness of approximately 8000 Å. Thereafter, layers 93 and 94 are patterned by selective etchants to form the contacts 91 as illustrated in FIG. 1f. Later, to complete the process, a passivation layer 95 is formed over the entire structure.

One preferred method for forming field effect transistors in accordance with the invention has now been described in detail. In addition, the various changes and modifications may be made to this particular method without departing from the nature and spirit of the invention. For example, the modification illustrated in FIGS. 6a and 6b provides for two levels of polysilicon interconnects to be made.

Figure 6A:
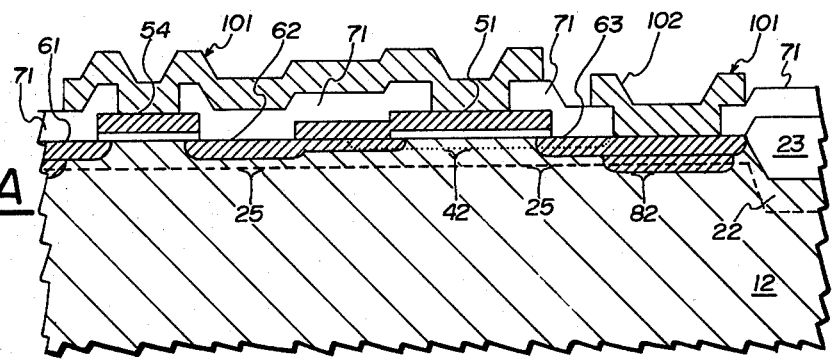
FIGS. 6a–6b are a pair of greatly enlarged cross-sectional views of transistors at various stages in a modification of the above fabrication process.
Figure 6B:
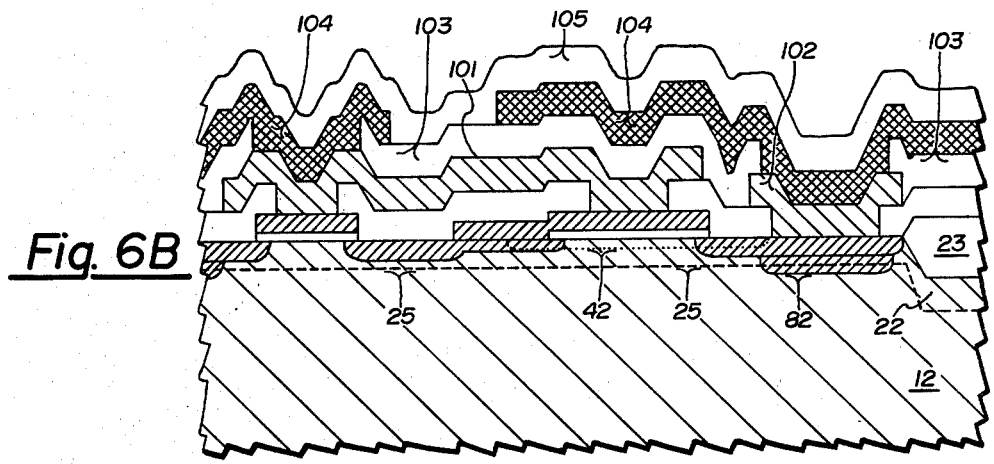

In this modified method, all of the steps that were previously described in conjunction with FIGS. 1a–1e are carried out; and thereafter the process proceeds as illustrated in FIGS. 6a and 6b. As an initial step, a second level polysilicon layer is deposited over the patterned insulating layers 71. This second level poly layer is then covered with photoresist and selectively removed to leave patterned portions 101. Preferably, the second level polysilicon layer is formed in the same manner as was previously described in conjunction with the formation of the patterned first level polysilicon regions 52, 53, and 54. This avoids the need for a high temperature annealing step of long duration, which would destroy the doping profile in the source, channel, and drain regions.

Also preferably, the second level polysilicon layer is patterned to lie over all of the source and drain regions where a diffusion to metal contact would normally be made. Reference numeral 102 in FIG. 6a indicates the placement of one of these second level polysilicon "patches". The insertion of these patches is made because the oxide which exists between the two polysilicon levels is almost as thick as the oxide which exists over the second level poly, and this makes it difficult to simultaneously etch via holes for metal contacts to both the second level poly and to the underlying diffusion regions. That is, the large difference in oxide thickness between the metal layer and second level polysilicon layer, and the metal layer and underlying diffusion regions would lead to severe undercutting if both contacts were etched at the same time.

The manner in which this problem is overcome by the inclusion of polysilicon patches 102 is illustrated in FIG. 6b. After the second level poly layer is patterned, a layer of silicon dioxide is formed thereon; and contact holes are then etched in it down to the second level polysilicon layer. Reference numeral 103 indicates those portions of the insulating layer which remain after these contact holes are etched. This eliminated the above described undercutting problem since each of the holes that are etched are of approximately the same depth.

The should also be pointed out, that the insulating layer from which the patterned regions 103 are formed is preferably deposited in the same manner as was previously described in conjunction with FIG. 4. That is, it is formed in a specially constructed deposition system which lays down the insulating layer sufficiently smoothly to eliminate the need for a conventional reflow step. This insures that the doping density profiles of the source, drain, and channel regions are not destroyed by diffusion.

Thereafter, layered metallic contacts 104 are formed on the patterned insulating layer 103. This is achieved by performing the steps that were previously described above in conjunction with FIG. 5. Thereafter, a passivation layer 105 is formed over the entire surface to complete the fabrication process.

Various preferred methods for constructing field effect transistors in accordance with the invention have now been described in detail. In addition, many modifications may be made to these methods without departing from the nature and spirit of the invention. Thus, it is to be understood that the invention is not limited to said details but as defined by the appended claims.

What is claimed is:

1. A method of forming a field effect transistor of the type which comprises a semiconductor substrate having a major surface, spaced-apart source and drain regions in said substrate adjacent said surface, a channel region in said substrate adjacent said surface and said source and drain regions, and a gate overlying said channel region; wherein said method includes the steps of:

implanting dopant atoms of a first conductivity type into at least said channel region to form a peak density of said first conductivity type dopant atoms at a predetermined depth below said surface of said channel and a substantially lower density of said first conductivity type dopant atoms at said surface of said channel, which peak density reduces reachthrough at said predetermined depth beneath the surface of said channel without adversely increasing the channel's threshold voltage;

implanting dopant atoms of a second conductivity type opposite to said first conductivity type into said source and drain regions to form source and drain junctions with said channel having radii at said surface of less than said predetermined depth, which radii operate to reduce reachthrough at said surface of said channel above said predetermined depth; and depositing a smooth insulating layer over said gate at subatmospheric pressures and at temperatures that are below the insulating layer's flow point to eliminate the need for a separate reflow step to smooth out said layer, which reflow step would adversely alter the distribution of said implanted dopant atoms.

2. A method according to claim 1 and further including the steps of:

implanting atoms into a backside surface of said substrate to locally disrupt the inter-atomic bonding of the substrate to a predetermined depth; and heating said substrate before said channel region is implanted to diffuse a substantial portion of any impurities contained in the substrate to the disrupted bonding sites without diffusing said dopant density in said channel.

3. A method according to claim 1, wherein subsequent to said implanting of said channel, a mixture of polysilicon and dopant atoms are simultaneously deposited as a conductive layer over said surface.

4. A method according to claim 3, wherein portions of said deposited layer are removed by an anisotropic planar plasma etch.

5. A method according to claim 1, and further including the step of forming openings in said insulating layer to expose said source or drain region and expose a portion of the adjacent substrate, and wherein said dopant atoms of said second conductivity type are implanted into said openings.

6. A method according to claim 5, and further including the steps of:

forming a layer of a silicide of a noble metal over the surface of the source or drain region that is exposed through said openings;

disposing over said silicide, a layer of a barrier material that prevents the diffusion of a preselected conductive material therethrough; and disposing a layer of said conductive material over said barrier layer.

7. A method according to claim 5, and further including the steps of:

forming a layer of polysilicon over the surface of the source or drain region that is exposed through said opening;

forming a layer of a silicide of a noble (nobel) metal over said polysilicon layer;

disposing over said silicide, a layer of a barrier material that prevents the diffusion of a preselected conductive material therethrough; and disposing a layer of said conductive material over said barrier layer.

8. A method according to claim 1, wherein said dopant atoms of said first conductivity type are P-type, and said dopant atoms of said second conductivity type are N-type.

9. A method according to claim 1, wherein said dopant atoms of said first conductivity type are N-type, and said dopant atoms of said second conductivity type are P-type.

10. A method according to claim 1, wherein said relatively high dopant density is at least twenty times said lower dopant density.

11. A method according to claim 1, wherein said relatively high dopant density and said lower dopant density respectively are approximately $1.5 \times 10^{16}$ atoms/cm$^3$ and $4 \times 10^{15}$ atoms/cm$^3$.

12. A method according to claim 1, wherein said insulating layer is $SiO_2$.

13. A method according to claim 1, wherein said insulating layer is formed by a deposition of undoped $SiO_2$ at temperatures of less than 600° C.

14. A method of forming a field effect transistor of the type which comprises a semiconductor substrate having a major surface, spaced-apart source and drain regions in said substrate adjacent said surface, a channel region in said substrate adjacent said surface and said source and drain regions, and a gate overlying said channel region; wherein said method includes the steps of:

implanting dopant atoms of a first conductivity type into at least said channel region to form a peak density of said first conductivity type dopant atoms at a predetermined depth below said surface of said channel and a substantially lower density of said first conductivity type dopant atoms at said surface of said channel, which peak density reduces reachthrough at said predetermined depth beneath said surface of said channel without adversely increasing the channel's threshold voltage;

implanting dopant atoms of a second conductivity type opposite to said first conductivity type into said source and drain regions to form source and drain junctions with said channel having radii at said surface of less than said predetermined depth, which radii operate to reduce reachthrough at said surface of said channel above said predetermined depth.

15. A method according to claim 14, and further including the step of depositing a smooth insulating layer on said surface at subatmospheric pressures and at temperatures that are below the insulating layer's flow point to avoid diffusing the distribution of said implanted dopant atoms by eliminating the need for a separate reflow step to smooth out said layer.

16. A method according to claim 14, wherein said relatively high dopant density is at least twenty times the magnitude of and has a substantially smaller tolerance than the substrate dopant density to mullify any concentration tolerances in the substrate dopant density.

17. A method according to claim 14, and further including the step of implanting dopant atoms of said second conductivity type in said channel between said predetermined depth and said surface to adjust the channel's threshold voltage.

18. A method of forming a field effect transistor of the type which comprises a semiconductor substrate having a major surface, spaced-apart source and drain regions in said substrate adjacent said surface, a channel region in said substrate adjacent said surface and said source and drain regions, having a peak density of first conductivity type dopant atoms at a predetermined depth below said surface of said channel, and a gate overlying said channel region; wherein said method includes the steps of:

implanting dopant atoms of a second conductivity type opposite to said first conductivity type into said source and drain regions to form source and drain junctions with said channel having radii at said surface of less than said predetermined depth, which radii operate to reduce reachthrough at said surface of said channel above said predetermined depth; and depositing a smooth insulating layer over said gate at subatmospheric pressures and at temperatures that are below the insulating layer's flow point to eliminate the need for a separate reflow step to smooth out said layer, which reflow step would adversely alter the distribution of said implanted dopant atoms.

* * * * *